(12) United States Patent
Shiraiwa et al.

(10) Patent No.: US 9,240,340 B2
(45) Date of Patent: Jan. 19, 2016

(54) ELECTROSTATIC CHUCK

(71) Applicant: Shinko Electric Industries Co., LTD., Nagano-ken (JP)

(72) Inventors: Norio Shiraiwa, Nagano (JP); Jiro Kawai, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 76 days.

(21) Appl. No.: 13/863,870

(22) Filed: Apr. 16, 2013

(65) Prior Publication Data

US 2013/0286531 A1 Oct. 31, 2013

(30) Foreign Application Priority Data

Apr. 26, 2012 (JP) .................................. 2012-100925

(51) Int. Cl.
*H01L 21/683* (2006.01)

(52) U.S. Cl.
CPC ................................. *H01L 21/6833* (2013.01)

(58) Field of Classification Search
CPC .................................................. H01L 21/6833
See application file for complete search history.

(56) References Cited

U.S. PATENT DOCUMENTS

| | | | | |
|---|---|---|---|---|
| 5,539,179 A | * | 7/1996 | Nozawa et al. | 219/121.43 |
| 6,151,203 A | * | 11/2000 | Shamouilian et al. | 361/234 |
| 8,542,474 B2 | * | 9/2013 | Yonekura et al. | 361/234 |

FOREIGN PATENT DOCUMENTS

| | | |
|---|---|---|
| JP | 2006-344613 A | 12/2006 |
| WO | WO 2006/073947 A2 | 7/2006 |

* cited by examiner

*Primary Examiner* — Thienvu Tran
*Assistant Examiner* — Tien Mai
(74) *Attorney, Agent, or Firm* — Wolf, Greenfield & Sacks, P.C.

(57) ABSTRACT

An electrostatic chuck includes a base having a first through hole extending through the base. An electrostatic chuck attraction plate is bonded to the base. An attraction electrode is incorporated in the electrostatic chuck attraction plate to generates electrostatic charge and electrostatically attract an attraction subject. A recess is formed in the electrostatic chuck attraction plate in alignment with the first through hole. The recess partially exposes the attraction electrode. An adhesive layer is formed between the electrostatic chuck attraction plate and the base. The adhesive layer covers an inner surface of the recess. A tubular insulator is arranged in the recess. The tubular insulator includes a second through hole. A power supply terminal is arranged in the first through hole and the second through hole. The power supply terminal includes a distal portion electrically connected to the attraction electrode.

11 Claims, 7 Drawing Sheets

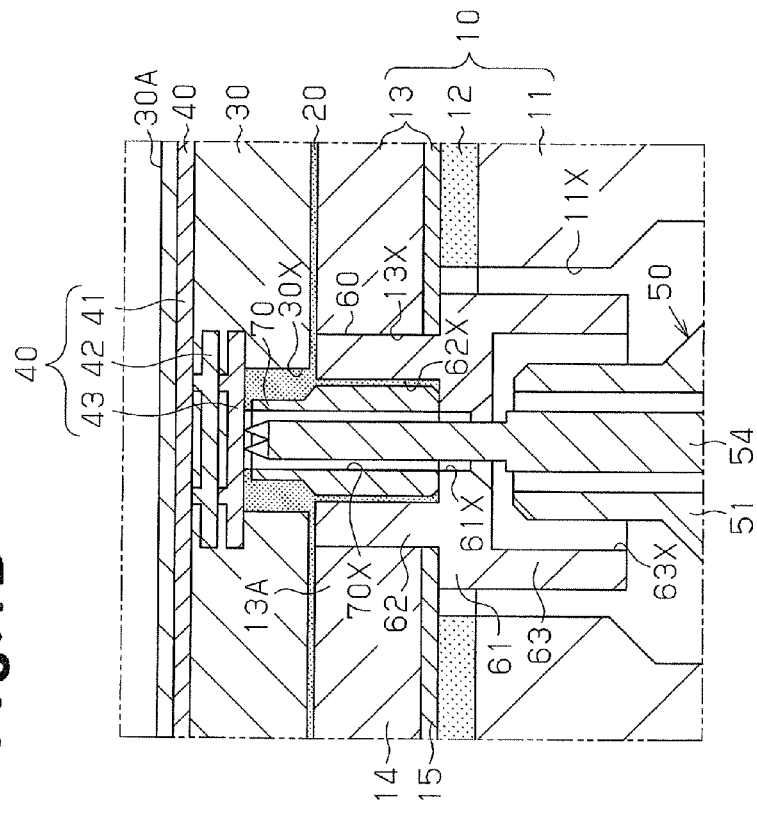
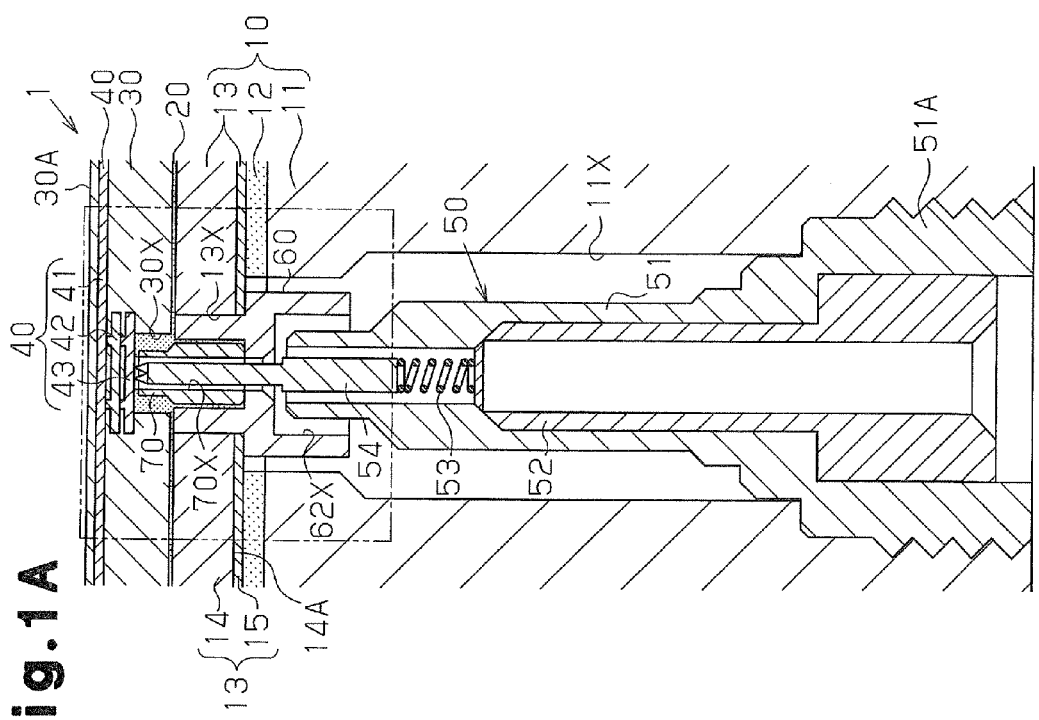

Fig.6

| Sample | Discharge Test |
|---|---|
| 1 | Discharge not occurred |
| 2 | Discharge not occurred |
| 3 | Discharge not occurred |
| 4 | Discharge not occurred |
| 5 | Discharge not occurred |
| 6 | Discharge occurred at 8.9kV |
| 7 | Discharge occurred at 3.7kV |
| 8 | Discharge occurred at 7.1kV |
| 9 | Discharge occurred at 8.5kV |
| 10 | Discharge occurred at 4.5kV |

US 9,240,340 B2

ELECTROSTATIC CHUCK

CROSS-REFERENCE TO RELATED APPLICATIONS

This application is based upon and claims the benefit of priority from prior Japanese Patent Application No. 2012-100925, filed on Apr. 26, 2012, the entire contents of which are incorporated herein by reference.

TECHNICAL FIELD

The present disclosure relates to an electrostatic chuck.

BACKGROUND ART

Film deposition systems (e.g., chemical vapor deposition (CVD) systems and physical vapor deposition (PVD) systems) and plasma etching systems, which are used in the manufacturing processes of semiconductor devices such as integrated circuits (ICs) and large scale integration (LSI) circuits, each include a stage for accurately holding a substrate (e.g., silicon wafer) in a vacuum processing chamber. Japanese Laid-Open Patent Publication No. 2006-344613 describes an example of an electrostatic chuck, which is used as such a stage.

The electrostatic chuck includes an electrostatic chuck (ESC) attraction plate that electrostatically holds a substrate (silicon wafer). The electrostatic chuck performs temperature control to maintain the substrate held by the chuck at a controlled temperature. The electrostatic chuck may be a Coulomb electrostatic chuck or a Johnsen-Rahbek electrostatic chuck. The Coulomb electrostatic chuck generates attraction force that is highly responsive to the applied voltage. However, the Coulomb electrostatic chuck requires the application of high voltage. Further, the Coulomb electrostatic chuck cannot generate sufficient attraction force when the contact area is small between the ESC attraction plate and the substrate. The Johnsen-Rahbek electrostatic chuck generates sufficient attraction force even when the contact area between the ESC attraction plate and the substrate is small. However, the Johnsen-Rahbek electrostatic chuck requires current to be supplied to the substrate.

FIG. 7 is a cross-sectional view illustrating a referential example of an electrostatic chuck 80. The electrostatic chuck 80 includes a base 81 and an ESC attraction plate 83 bonded to the base 81 by an adhesive layer 82. The base 81 may be formed from, for example, aluminum. The adhesive layer 82 may be formed from, for example, silicone resin.

The base 81 supports the ESC attraction plate 83. The base 81 incorporates a heater 84. The heater 84, which generates heat when supplied with voltage, maintains the ESC attraction plate 83 at a controlled temperature with the adhesive layer 82.

The ESC attraction plate 83 incorporates an electrode 85. The electrode 85 is a thin-film electrostatic electrode. The electrode 85 is connected via a power supply unit 86 to a direct current (DC) power supply 87, which is arranged outside the electrostatic chuck 80.

FIG. 8 is a partially enlarged view of the power supply unit 86 illustrated in FIG. 7. The power supply unit 86 includes a power supply terminal 86A. A distal portion 86B of the power supply terminal 86A is electrically connected to the electrode 85 and is in contact with a lower surface of a wiring layer 85A, which is bonded to the adhesive layer 82. The electrode 85 is electrically connected to the DC power supply 87 (refer to FIG. 7) via the wiring layer 85A and the power supply terminal 86A. In the example of FIG. 8, an elastic member 86C, which is coupled to a basal portion of the power supply terminal 86A, presses the power supply terminal 86A against the lower surface of the wiring layer 85A.

The electrostatic chuck 80 includes a tubular insulator 88. The insulator 88 functions to insulate the power supply terminal 86A from the aluminum base 81. However, as indicated by the thick double-headed arrow in FIG. 8, the distal portion 86B of the power supply terminal 86A is insulated from the base 81 solely by the silicone resin adhesive layer 82. Any voids in the adhesive layer 82 or any insufficient formation of the adhesive layer 82 around the distal portion 86B of the power supply terminal 86A may result in insufficient electric insulation of the adhesive layer 82. This may cause discharge between the distal portion 86B and the base 81.

SUMMARY

One aspect of the present invention is an electrostatic chuck provided with a base including a first through hole extending through the base in a thickness direction. An electrostatic chuck attraction plate is bonded to the base. An attraction electrode is incorporated in the electrostatic chuck attraction plate. The attraction electrode generates electrostatic charge to electrostatically attract an attraction subject with the electrostatic chuck. A recess is formed in the electrostatic chuck attraction plate in alignment with the first through hole of the base. The recess partially exposes the attraction electrode. An adhesive layer is formed between the electrostatic chuck attraction plate and the base. The adhesive layer covers an inner surface of the recess. A tubular insulator is arranged in the recess. The tubular insulator includes a second through hole. A power supply terminal is arranged in the first through hole of the base and the second through hole of the tubular insulator. The power supply terminal includes a distal portion that is electrically connected to the attraction electrode exposed from the recess.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1A is a schematic cross-sectional view partially illustrating one embodiment of an electrostatic chuck, and FIG. 1B is an enlarged cross-sectional view of the electrostatic chuck of FIG. 1A;

FIG. 6 is a table showing the evaluation results of the reliability of insulation between an electrode terminal and a base;

DETAILED DESCRIPTION OF EMBODIMENTS

Figure 2A:
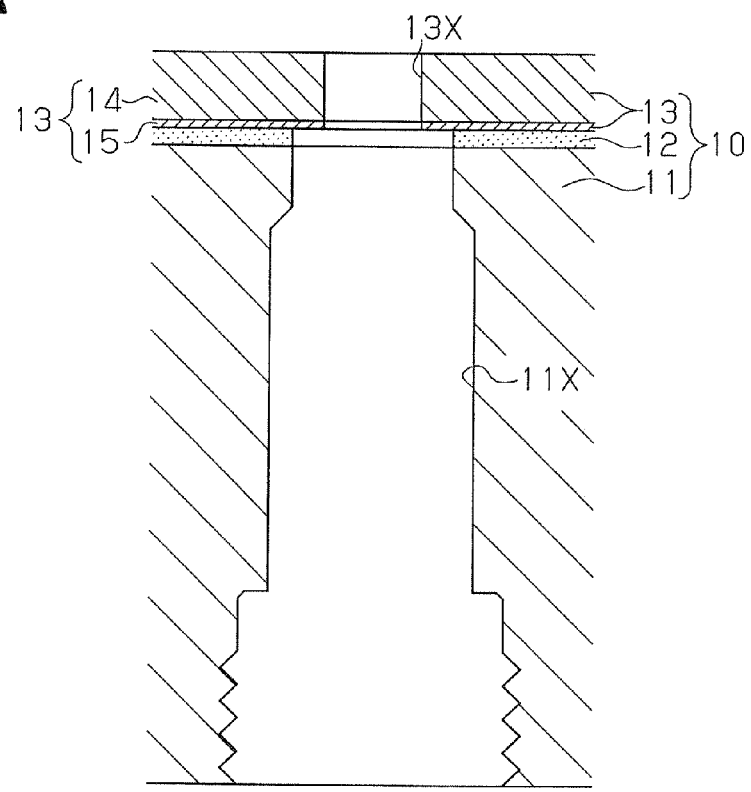
FIG. 2A, FIG. 2B, FIG. 3A, FIG. 3B, FIG. 4, and FIG. 5 are schematic cross-sectional views illustrating a method for manufacturing the electrostatic chuck.

Embodiments will now be described with reference to the attached drawings. To facilitate understanding, features are enlarged in the drawings, which are not in actual scale. Further, to facilitate understanding, cross-sectional views may illustrate resin layers without hatching lines.

One embodiment of an electrostatic chuck 1 will now be described with reference to FIG. 1A to FIG. 6.

Like the electrostatic chuck 80 of the referential example, the electrostatic chuck 1 includes a base 10, an adhesive layer 20, an electrostatic chuck (ESC) attraction plate 30, which is bonded to the base 10 by the adhesive layer 20, an attraction electrode 40, which is incorporated in the ESC attraction plate 30, and a connector 50, which is electrically connected to the attraction electrode 40.

The base 10 supports the ESC attraction plate 30. The base 10 includes a base plate 11, an adhesive layer 12, and a heater plate 13. The heater plate 13 is bonded to the base plate 11 by the adhesive layer 12.

The base plate 11 may be formed from a conductive material. For example, the base plate 11 may be formed from a metal material, such as aluminum or cemented carbide, or a composite material of the metal material and a ceramic material. In a preferred example, the base plate 11 is formed from aluminum or an aluminum alloy, which is easy to obtain and process and which has good heat conductivity. The base plate 11 has an anodized surface on which an insulating layer is formed. The base plate 11 may have a thickness of, for example, about 35 to 40 mm.

The adhesive layer 12 is used to mainly improve heat conduction between the base plate 11 and the heater plate 13. In one example, the heater plate 13 heats an attraction subject held on the ESC attraction plate 30 (e.g., silicon wafer). However, when the attraction subject is heated rapidly by, for example, plasma, the heat needs to be released. Further, while the attraction subject is being heated, heat from the heater plate 13 also needs to be transferred to the base plate 11. Thus, the adhesive layer 12 is preferably formed from a material having high heat conductivity. For example, the adhesive layer 12 may be formed from silicone resin. The adhesive layer 12 may have a thickness of, for example, about 0.5 to 2.0 mm.

The heater plate 13 includes a metal plate 14, and a film of a heater 15, which is bonded to a lower surface 14A of the metal plate 14. The heater 15, which generates heat when supplied with voltage, maintains the ESC attraction plate 30 at a controlled temperature via the adhesive layer 20. The heater 15 is bonded to the base plate 11 by the adhesive layer 12. The metal plate 14 functions as a soaking plate. The metal plate 14 may be formed from, for example, aluminum or an aluminum alloy. The metal plate 14 may have a thickness of, for example, about 1.5 to 1.8 mm. The heater 15 may have a thickness of, for example, about 0.1 to 0.5 mm.

The heater 15 may be formed by, for example, patterning a heater electrode (metal wire) of a predetermined shape on a film of polyimide resin, forming another polyimide resin film in a manner that the heater electrode is sandwiched between the polyimide resin films, and then thermally curing the films to integrate the films and the heater electrode. The heater plate 13 may be formed by bonding the heater 15 onto the metal plate 14. The heater electrode may be formed from a conductive material, such as Inconel (registered trademark). Inconel (registered trademark) is a heat resistant alloy, the main components of which are nickel (Ni) and about 15% to 23% of chromium (Cr) and may further contain iron (Fe), cobalt (Co), or molybdenum (Mo). Inconel has high processability, allows both hot processing and cold processing, and has high corrosion resistance.

The adhesive layer 20 is mainly used to maintain good heat conduction between the heater plate 13 and the ESC attraction plate 30. The adhesive layer 20 may preferably be formed from a highly conductive material, such as silicone resin. The adhesive layer 20 may be formed between an upper surface of the heater plate 13 and a lower surface of the ESC attraction plate 30. The adhesive layer 20 may have a thickness of, for example, 0.05 to 0.2 mm.

The ESC attraction plate 30 has an attraction surface 30A (upper surface in FIG. 1A) for electrostatically holding an attraction subject. The ESC attraction plate 30 may be formed from an insulating material. For example, the ESC attraction plate 30 may be formed from a ceramic material such as alumina, aluminum nitride, and silicon nitride, or an organic material such as silicone resin and polyimide resin. In the illustrated example, the ESC attraction plate 30 is formed from a ceramic material, such as alumina or aluminum nitride, which is easy to obtain and process and has a relatively highly resistance to plasma. The ESC attraction plate 30 may further preferably be formed from aluminum nitride, which has a high heat conductivity of 150 to 250 W/(m*K). Aluminum nitride reduces in-plane temperature variations of the attraction subject held on the ESC attraction plate 30 and is thus preferable. The ESC attraction plate 30 may be slightly smaller than an attraction subject (e.g., diameter of 300 mm), which is attracted to the attraction surface 30A. This prevents at least the attraction surface 30A from being exposed to plasma. The ESC attraction plate 30 may have a thickness of, for example, about 2 to 10 mm.

The attraction electrode 40 is embedded in the ESC attraction plate 30. The attraction electrode 40 may include an electrode layer 41, which is formed near the attraction surface 30A in the ESC attraction plate 30, a first wiring layer 42, which is electrically connected to the electrode layer 41, and a second wiring layer 43, which is electrically connected to the first wiring layer 42. The electrode layer 41 is a thin-film electrostatic electrode supplied with DC voltage for electrostatic attraction. The first wiring layer 42 and the second wiring layer 43 are used to connect the electrode layer 41 to a layer under the ESC attraction plate 30. The ESC attraction plate 30 formed from a ceramic material. Thus, the electrode layer 41, the first wiring layer 42, and the second wiring layer 43 may preferably be formed from tungsten (W), molybdenum, or copper (Cu). The desired ESC attraction plate 30 may be formed by, for example, performing thick film processing of patterning the electrode layer 41, the first wiring layer 42, and the second wiring layer 43 in ceramic green sheets, which have been laminated to a predetermined thickness, and baking the integrally laminated layers with a ceramic material arranged in the layers. The thickness from the lower surface of the ESC attraction plate 30 to the lower surface of the electrode layer 41 may be, for example, about 1.8 to 9.4 mm. The thickness from the upper surface of the electrode layer 41 to the attraction surface 30A of the ESC attraction plate 30 may be, for example, about 0.2 to 0.6 mm. The ESC attraction plate 30 may include a plurality of RF electrode layers supplied with high-frequency power for controlling plasma. The RF electrode layers are embedded in the lower surface of the ESC attraction plate 30 opposite to the attraction surface 30A or in a lower portion of the ESC attraction plate 30.

A connector 50, which connects the attraction electrode 40 and the DC power supply that supplies DC voltage to the attraction electrode 40, will now be described. The connector 50 may be referred to as a power supply component or a socket.

A through hole 11X extends through the base plate 11 and the adhesive layer 12 in the thickness direction of the base plate 11 and the adhesive layer 12. A through hole 13X extends through the heater 15 and the metal plate 14 of the heater plate 13 in the thickness direction in alignment with the through hole 11X. The through hole 13X communicates with the through hole 11X. The through hole 13X has a smaller opening diameter than the through hole 11X. As illustrated in FIG. 1B, a portion of the heater plate 13 including the rim and the wall of the through hole 13X functions as a protrusion 13A, which protrudes inward from the rim of the through hole 11X as viewed from above. The protrusion 13A and the wall of the through hole 11X form a step. In the illustrated example, the base 10 has the step formed between the base plate 11 and the heater plate 13. The through holes 11X and 13X, which extend through the base plate 11, the adhesive layer 12, the heater 15, and the metal plate 14 in the thickness direction, form an example of a first through hole that extends through the base 10 in the thickness direction. The through hole 11X may, for example, be circular, have a diameter of about 4 to 5 mm at the rim where the through hole 11X communicates with the through hole 13X. The through hole 13X may, for example, be circular and have a diameter of, for example, about 2 to 3 mm.

An insulator 60 is bonded to the heater plate 13. In one example, the insulator 60 is bonded to the protrusion 13A of the heater plate 13 by an adhesive (not illustrated). The insulator 60 includes a base 61 having a through hole 61X, a first tubular portion 62 extending from an upper surface of the base 61, and a second tubular portion 63 extending from a lower surface of the base 61. The base 61, the first tubular portion 62, and the second tubular portion 63 are formed integrally. The first tubular portion 62 communicates with the through hole 61X and includes an opening 62X with a larger diameter than the through hole 61X. The second tubular portion 63 communicates with the through hole 61X and includes an opening 63X with a larger diameter than the through hole 61X and the opening 62X. The outer surface of the first tubular portion 62 is bonded to the inner surface of the protrusion 13A, and a section of the upper surface of the base 61 extending outwardly from the first tubular portion 62 is bonded to the lower surface of the protrusion 13A. The upper surface of the insulator 60 (upper surface of the first tubular portion 62) is flush with the upper surface of the heater plate 13 (upper surface of the metal plate 14). The base 61 may have a thickness of, for example, about 1.7 mm to 1.9 mm. The through hole 61X may be circular as viewed from above and have a diameter of, for example, about 1.2 mm to 1.5 mm. The opening 62X may be circular as viewed from above and have a diameter of, for example, about 1.6 mm to 1.8 mm. The opening 63X may be circular as viewed from above and have a diameter of, for example, about 2 mm to 3 mm. The insulator 60 may be formed from an insulating material, for example, a resin material such as a plastic material.

The ESC attraction plate 30 includes a recess 30X aligned with the through hole 13X of the heater plate 13. The recess 30X allows the lower surface of the second wiring layer 43 to be at least partially exposed. The recess 30X communicates with the through holes 13X and 11X. For example, when the insulator 60 is bonded to the heater plate 13, the recess 30X communicates with the through hole 11X of the base plate 11 via the opening 62X of the insulator 60 and the opening 63X of the through hole 61X. The recess 30X has a smaller diameter than the through hole 13X of the heater plate 13 and a larger diameter than the opening 62X of the first tubular portion 62. The recess 30X is deep enough to accommodate an insulator 70 (described later). In one example, the depth of the recess 30X may be set in accordance with the value of the DC voltage applied to the attraction electrode 40 and the breakdown voltage characteristics of the adhesive layer 20 formed in the recess 30X. The recess 30X may have a depth of, for example, about 1.3 mm to 1.5 mm.

The insulator 70, which is tubular, is arranged on the upper surface of the base 61, which is exposed from the opening 62X of the first tubular portion 62 of the insulator 60. The insulator 70 extends through the opening 62X (through hole 13X) in the thickness direction (upward), and also extends in the recess 30X in the thickness direction (upward). A distal portion of the insulator 70 is arranged in the recess 30X of the ESC attraction plate 30. In the illustrated example, the distal portion of the insulator 70 extends to an intermediate position of the recess 30X in the thickness direction. The insulator 70 may be formed from any insulating material and may be, for example, a resin material such as a plastic material.

The insulator 70 is tubular and has a through hole 70X extending along the tube. The through hole 70X communicates with the through hole 61X of the base 61. The through hole 70X has substantially the same diameter as the through hole 61X. In the illustrated example, the insulator 70 is bonded to at least the ESC attraction plate 30 by the adhesive layer 20, which bonds the heater plate 13 and the ESC attraction plate 30.

The adhesive layer 20 is formed between the heater plate 13 and the ESC attraction plate 30 and also between the insulator 60 and the insulator 70. For example, the adhesive layer 20 is formed between the outer surface of the insulator 70 and the inner surface of the first tubular portion 62. Although not illustrated, the adhesive layer 20 is also formed between the lower surface of the insulator 70 and the upper surface of the base 61. In the illustrated example, the adhesive layer 20 entirely covers the inner surface of the recess 30X and the upper surface of the distal portion of the insulator 70. The adhesive layer 20 includes an open end that conforms to the open end formed in the upper surface of the distal portion of the insulator 70.

The through holes 11X and 13X and the recess 30X are shaped to accommodate the connector 50. In the illustrated example, the connector 50 is arranged in the through hole 11X, the opening 63X and the through hole 61X of the insulator 60, the through hole 70X of the insulator 70, and the recess 30X of the ESC attraction plate 30. The connector 50 may include a tube 51 formed from an insulating material, a holder 52 arranged in and fixed to the tube 51, an elastic member 53 arranged in the tube 51 and coupled to the holder 52, and a power supply terminal 54 partially arranged in the tube 51 and coupled to the elastic member 53. The elastic member 53 may be, for example, a spring.

The tube 51 includes a threaded basal portion 51A fastened with a lower portion of the through hole 11X in the base plate 11 to fix the tube 51 to the base plate 11. A distal portion of the tube 51 is arranged in the opening 62X of the insulator 60. The tube 51 surrounds the holder 52 and the elastic member 53 and partially surrounds the power supply terminal 54. The tube 51 functions to insulate the holder 52 and the power supply terminal 54, which are inserted in the tube 51, from the base plate 11. The tube 51 may be formed from any insulating material, which may include a resin material such as a plastic material.

The holder 52 is fixed to the tube 51 with, for example, an adhesive (not illustrated). The holder 52 accommodates and supports a power cord (not illustrated), which is electrically connected to a DC power supply arranged outside the electrostatic chuck 1. The power cord is electrically connected to the power supply terminal 54. The elastic member 53 is arranged between a distal end of the holder 52 and a basal end of the power supply terminal 54. The distal portion of the power supply terminal 54 upwardly protrudes in the vertical direction from the tube 51. The distal portion of the power supply terminal 54 is in contact with a lower surface of the second wiring layer 43 exposed from the recess 30X. This allows the second wiring layer 43 to be electrically connected to the DC power supply via the power supply terminal 54, the power cord, and the like, and thereby electrically connects the electrode layer 41 and the DC power supply. The elastic member 53 elastically projects the power supply terminal 54 toward the second wiring layer 43. Thus, the distal portion of the power supply terminal 54 is pressed against the second wiring layer 43. This structure allows the power supply terminal 54 to be electrically connected to the second wiring layer 43 regardless of dimensional errors resulting from the coupling of the various components.

The power supply terminal 54 protruding from the tube 51 is surrounded by the insulators 60 and 70 and the adhesive layer 20. In other words, the insulators 60 and 70 and the adhesive layer 20 are formed to surround the power supply terminal 54 when the power supply terminal 54 is in contact with the second wiring layer 43. In the example illustrated in FIG. 1B, the insulator 60 (second tubular portion 63) is formed in the through hole 11X to surround the power supply terminal 54, which protrudes from the tube 51. The insulator 60 formed in the through hole 11X insulates the power supply terminal 54 and the base plate 11. In the through hole 13X, the insulators 60 and 70 and the adhesive layer 20 are formed to surround the power supply terminal 54. The insulators 60 and 70 and the adhesive layer 20 formed in the through hole 13X function to insulate the power supply terminal 54 and the heater plate 13. More specifically, the power supply terminal 54 and the heater plate 13 in the through hole 13X are separated from each other by three insulators (the insulators 60 and 70 and the adhesive layer 20). In the recess 30X, the insulator 70 and the adhesive layer 20 are formed to surround the power supply terminal 54. The insulator 70 and the adhesive layer 20 formed in the recess 30X function to insulate the power supply terminal 54 and the heater plate 13 (metal plate 14). In the recess 30X, the power supply terminal 54 and the heater plate 13 are separated from each other by two insulators (the insulator 70 and the adhesive layer 20).

The electrostatic chuck 1 applies DC voltage to the attraction electrode 40 via the connector 50 (including the power supply terminal 54) so that the ESC attraction plate 30 and the attraction subject produce opposite electric charges. This generates electrostatic force (Coulomb force) that holds the attraction subject on the attraction surface 30A of the ESC attraction plate 30. An increase in the voltage applied to the attraction electrode 40 increases the electrostatic holding force.

The operation of the electrostatic chuck 1 will now be described.

Figure 8:
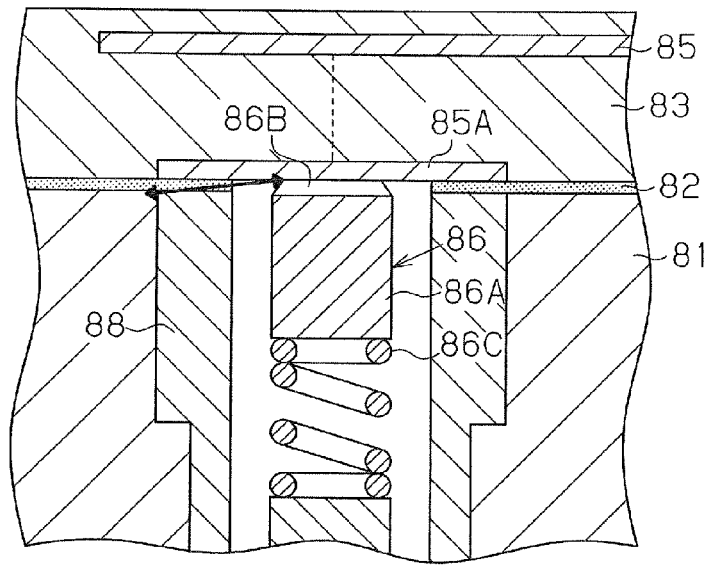
FIG. 8 is an enlarged cross-sectional view of a power supply unit arranged in the electrostatic chuck of FIG. 7.

In the electrostatic chuck 1, the ESC attraction plate 30 includes the recess 30X, which exposes the second wiring layer 43 that is connected to the electrode layer 41, the insulator 70, which is formed in the recess 30X, and the adhesive layer 20, which is formed to cover the entire inner surface of the recess 30X. This allows the distal portion of the power supply terminal 54, which is electrically connected to the second wiring layer 43, to be surrounded by two insulators, namely, the insulator 70 and the adhesive layer 20. Thus, this structure provides thicker insulation between the distal portion of the power supply terminal 54 and the heater plate 13 (metal plate 14) than the structure in which only the adhesive layer 82 is arranged between the distal portion 86B of the power supply terminal 86A and the base 81 (refer to FIG. 8). This improves the reliability of insulation between the power supply terminal 54 and the metal plate 14. The power supply terminal 54 is an example of an elongated distal terminal of a socket.

A method for manufacturing the electrostatic chuck 1 will now be briefly described.

As illustrated in FIG. 2A, the base plate 11 and the heater plate 13 are positioned so that the through hole 11X of the base plate 11 is aligned with the through hole 13X of the heater plate 13 under a situation in which the adhesive layer 12 is arranged between the base plate 11 and the heater plate 13. Subsequently, the adhesive layer 12 is cured (thermally cured) to bond the base plate 11 and heater plate 13 together with the adhesive layer 12. This completes the base 10 including the base plate 11 and the heater plate 13, through which the through hole 11X extends in the thickness direction.

Figure 2B:
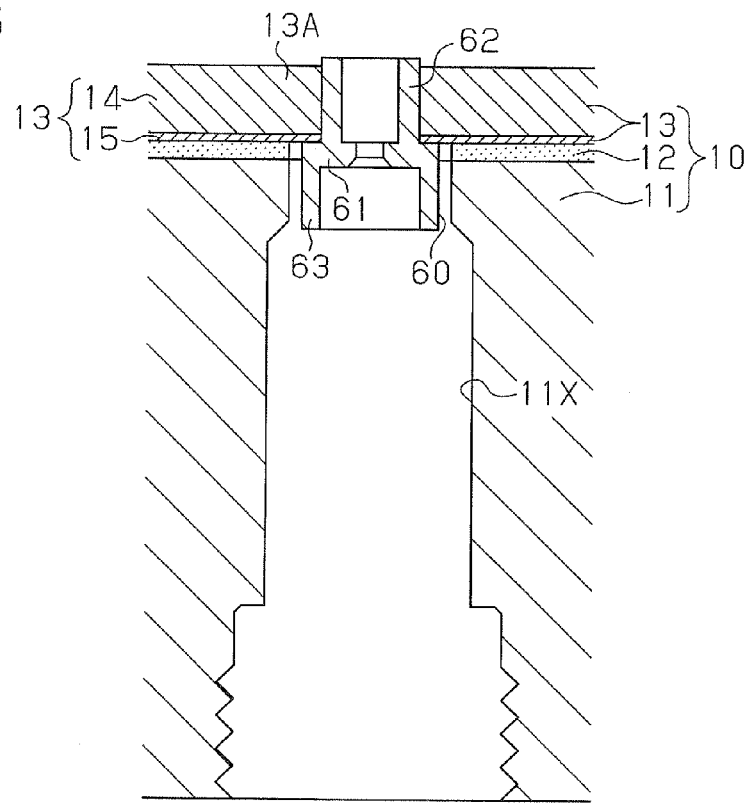

In the process illustrated in FIG. 2B, the insulator 60, having a surface coated with an adhesive (not illustrated), is inserted into the through hole 11X of the base plate 11 from below until the step formed by the upper surface of the base 61 of the insulator 60 and the outer surface of the first tubular portion 62 comes into contact with the protrusion 13A of the heater plate 13. Subsequently, the adhesive is cured to bond the heater plate 13 and the insulator 60 together with the adhesive.

Figure 3A:
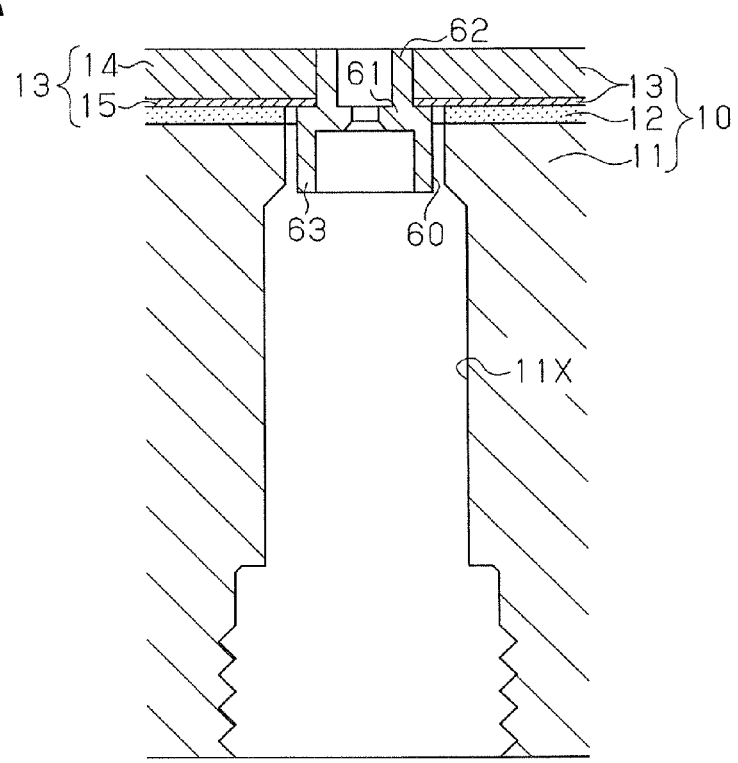

In the process illustrated in FIG. 3A, the base 10 and the insulator 60 are flattened so that the upper surface of the base 10 (metal plate 14) and the upper surface of the insulator 60 (first tubular portion 62) become flush with each other. More specifically, the upper surfaces of the base 10 (metal plate 14) and the insulator 60 are flattened through grinding or polishing. The grinding or polishing may include, for example, tool bit grinding with a tungsten carbide or diamond grinding bit (tool). Alternatively, the grinding or polishing may include chemical mechanical polishing (CMP).

Figure 3B:
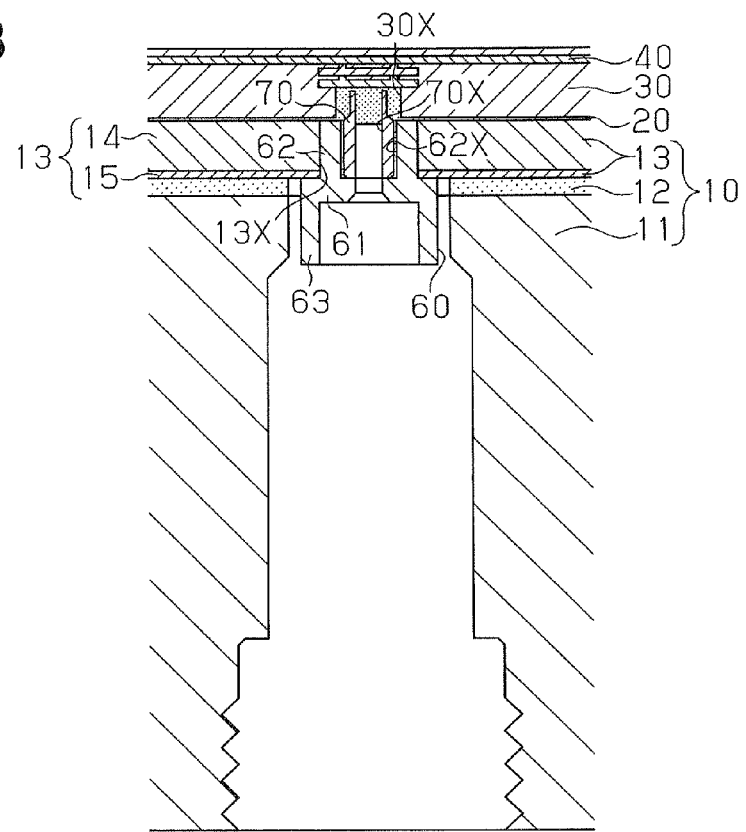

In the process illustrated in FIG. 3B, the insulator 70 is fitted into the opening 62X of the first tubular portion 62 of the insulator 60 from above the through hole 13X of the heater plate 13. The insulator 70 is arranged on the upper surface of the base 61 of the insulator 60, which is exposed from the opening 62X. The ESC attraction plate 30, which has been positioned to align the recess 30X with the through hole 70X of the insulator 70, is bonded to the base 10 with the adhesive layer 20. This arranges the distal portion of the insulator 70 in the recess 30X of the ESC attraction plate 30. In this process, the adhesive layer 20 is formed between the lower surface of the ESC attraction plate 30 and the upper surface of the metal plate 14, and also fills the recess 30X. The adhesive layer 20 is further formed between the outer surface of the insulator 70 and the inner surface of the first tubular portion 62 of the insulator 60. In other words, the ESC attraction plate 30 is mounted on the base 10 so that the adhesive layer 20 is formed between the lower surface of the ESC attraction plate 30 and the upper surface of the metal plate 14 in the recess 30X, and between the outer side of the insulator 70 and the inner surface of the insulator 60. The adhesive layer 20 is formed to have a controlled thickness between the base 10 and the ESC attraction plate 30. The adhesive layer 20 bonds the insulator 70 to the insulator 60.

Figure 4:
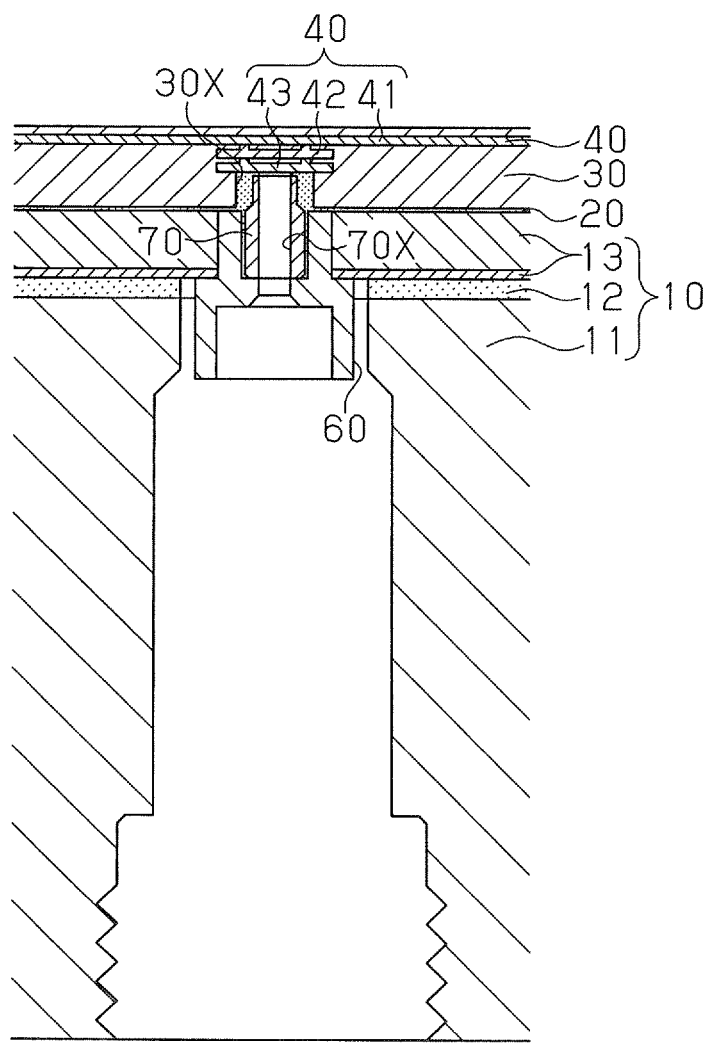

In the process illustrated in FIG. 4, excess portions are removed from the adhesive layer 20 formed in the process of FIG. 3B. For example, a portion of the adhesive layer 20 formed in the through hole 70X and a portion of the adhesive layer 20 formed over the through hole 70X and covering the lower surface of the second wiring layer 43 are removed. This partially exposes the lower surface of the second wiring layer 43, which is electrically connected to the electrode layer 41, in the recess 30X of the ESC attraction plate 30.

In the process illustrated in FIG. 4, the upper surface of the ESC attraction plate 30 undergoes grinding or polishing and is flattened. The grinding or polishing may be, for example, tool bit grinding or CMP.

Figure 5:
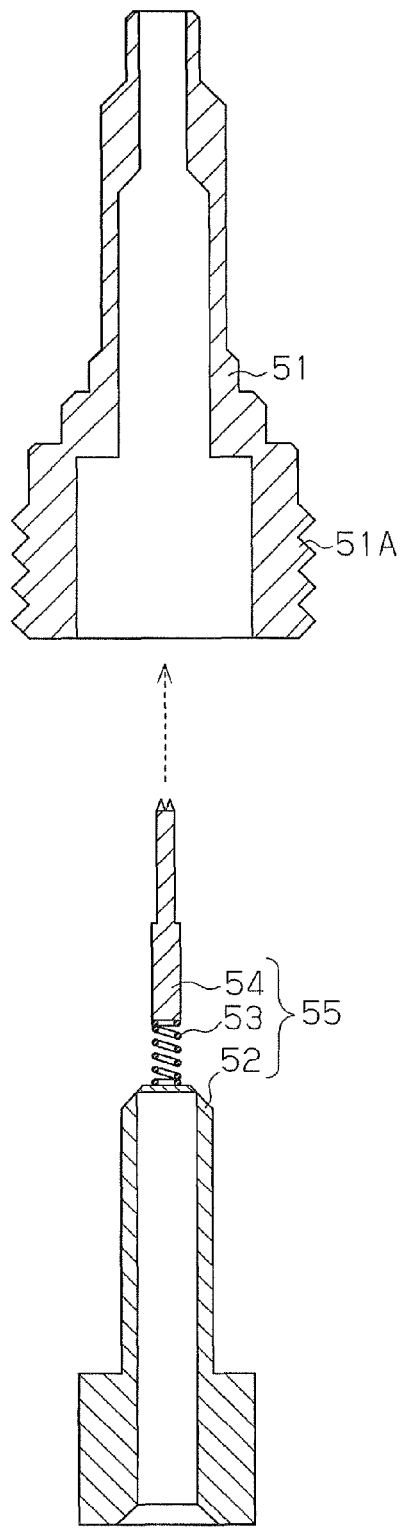
Figure 7:
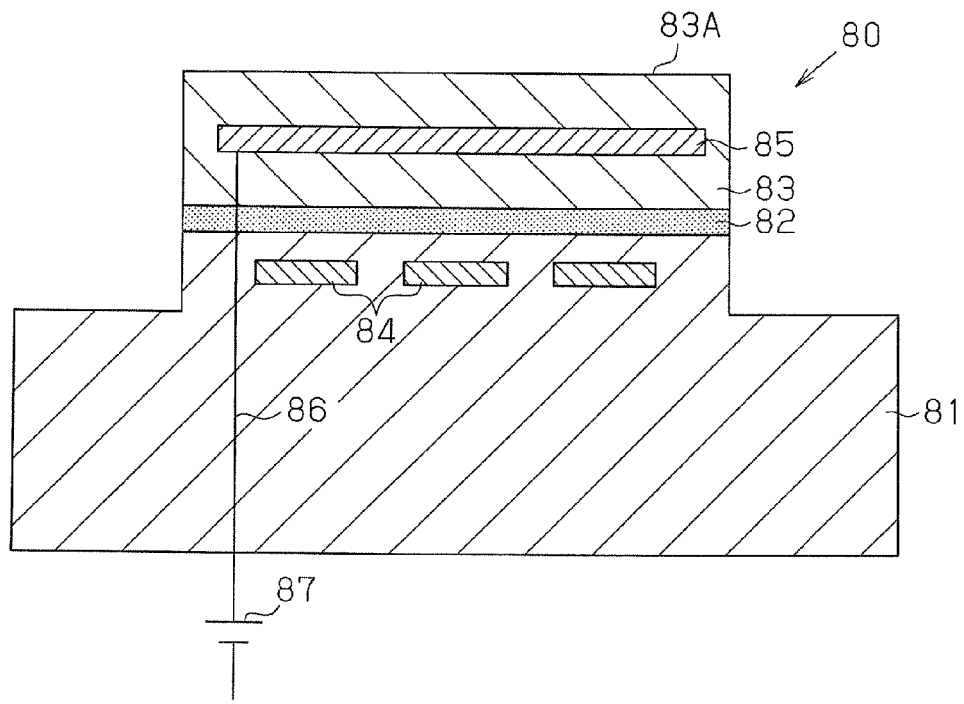
FIG. 7 is a schematic cross-sectional view illustrating a referential example of an electrostatic chuck.

In the process illustrated in FIG. 5, the power supply unit 55, which includes the holder 52, the elastic member 53, and the power supply terminal 54, is inserted into the tube 51 and bonded to the tube 51 by the adhesive (not illustrated). For example, the holder 52 is bonded to the tube 51 by the adhesive. This completes the connector 50 illustrated in FIG. 1. The basal portion 51A of the connector 50 is fastened to the through hole 11X to fix the connector 50 to the base 10. The elastic member 53 applies elastic force to the power supply terminal 54 so that the power supply terminal 54 comes in contact with the second wiring layer 43. The processes described above form the electrostatic chuck 1 illustrated in FIG. 1.

The through hole 11X is an example of a third through hole. The through hole 13X is an example of a fourth through hole. The adhesive layer 20 is an example of a first adhesive layer. The adhesive layer 12 is an example of a second adhesive layer. The insulator 70 is an example of a first insulator. The through hole 70X is an example of a second through hole. The insulator 60 is an example of a second insulator. The insulator 70 and the adhesive layer 20 form a double-layer insulating structure that surrounds the power supply terminal 54 in the recess 30X. The insulator 70, the first tubular portion 62 of the insulator 60, and a tubular part of the adhesive layer 20, which bonds the insulator 70 and the first tubular portion 62 form a triple-layer insulating structure that surrounds the power supply terminal 54 in the through hole 13X.

The results of a continuous experiment conducted on the electrostatic chuck 1 under severe conditions will now be described with reference to FIG. 6.

To evaluate the insulation performance, samples 1 to 10 were prepared. Samples 1 to 5 had the same structure as the electrostatic chuck 1 of FIG. 1. Samples 1 to 5 each include the recess 30X with a depth of 1.3 mm that receives the plastic insulator 70. The inner surface of the recess 30X in each of samples 1 to 5 is entirely covered by the adhesive layer 20, which is formed from silicone resin. Comparative samples 6 to 10 have the same structure as the electrostatic chuck of the referential example illustrated in FIG. 8. Further, comparative samples 6 to 10 each do not include the recess 30X nor the insulator 70 illustrated in FIG. 1, and the insulator arranged between the power supply terminal and the base is only an adhesive layer formed from silicone resin.

For the electrode chuck of each of samples 1 to 10, DC voltage was applied to the electrode. The DC voltage was increased gradually from 0 V to 10 kV to check whether a discharge occurred between the power supply terminal and the base. FIG. 6 shows the results.

For samples 6 to 10 having the same structure as the referential example, a discharge occurred between the power supply terminal and the base before the DC voltage reached 10 kV. For samples 1 to 5 having the structure illustrated in FIG. 1, a discharge did not occur between the power supply terminal 54 and the metal plate 14 of the base 10 even when applying a DC voltage of 10 kV to the attraction electrode 40. The results indicate that the two insulators arranged in the relatively deep recess 30X, namely, the insulator 70 and the insulating adhesive layer 20, improve the reliability of insulation between the power supply terminal 54 and the metal plate 14.

The above embodiment has the advantages described below.

(1) The ESC attraction plate 30 includes the recess 30X, which at least partially exposes the attraction electrode 40 (particularly, the second wiring layer 43 connected to the electrode layer 41). The insulator 70 is arranged in the recess 30X. The entire inner surface of the recess 30X is covered by the adhesive layer 20. In this structure, the distal portion of the power supply terminal 54 is surrounded by the two insulators, namely, the insulator 70 and the adhesive layer 20 under a situation in which the power supply terminal 54 is electrically connected to the attraction electrode 40. This structure increases the thickness of insulation between the distal portion of the power supply terminal 54 and the heater plate 13 (metal plate 14) and thereby improves the reliability of insulation between the power supply terminal 54 and the metal plate 14. This structure also reduces or prevents discharges between the power supply terminal 54 and the metal plate 14 of the base 10 and improves the durability of the electrostatic chuck 1.

The distal portion of the power supply terminal 54 and the metal plate 14 are insulated from each other by the silicone resin adhesive layer 20 and the insulator 70 and not only the adhesive layer 20. Thus, even if voids are formed in the adhesive layer 20, the insulator 70 insulates the distal portion of the power supply terminal 54 from the metal plate 14.

(2) The recess 30X has a depth set in accordance with the value of the DC voltage applied to the attraction electrode 40 and the breakdown voltage characteristics of the adhesive layer 20 formed in the recess 30X. When, for example, a DC voltage of about 10 kV is applied to the attraction electrode 40, the breakdown voltage characteristics of the adhesive layer 20 (e.g., silicone resin) is 12 kV/mm. In this case, it is preferable that the recess 30X has a depth of 0.8 mm or more (0.8*12=9.6 kV). In the present embodiment, the recess 30X has a depth of 1 mm or more (e.g., about 1.3 mm to 1.5 mm). This effectively reduces or prevents discharges between the power supply terminal 54 and the metal plate 14 even when a DC voltage of about 10 kV is applied to the attraction electrode 40. In this manner, optimal adjustment of the depth of the recess 30X reduces or prevents discharges. Thus, the durability of the electrostatic chuck 1 may easily be improved, while allowing the desired DC voltage to be applied to the attraction electrode 40.

It should be apparent to those skilled in the art that the present invention may be embodied in many other specific forms without departing from the spirit or scope of the invention. Particularly, it should be understood that the present invention may be embodied in the following forms.

Although it is preferable that the entire inner surface of the recess 30X be covered by the adhesive layer 20, the inner surface of the recess 30X may be covered by the adhesive layer. This modification also allows the two insulators, namely, the adhesive layer 20 and the insulator 70, to insulate the power supply terminal 54 placed in the recess 30X from the metal plate 14. This structure improves the reliability of insulation between the power supply terminal 54 and the metal plate 14.

The distal portion of the insulator 70 may be extended to contact the lower surface of the second wiring layer 43. This ensures that the insulator 70 and the adhesive layer 20 surround the entire distal portion of the power supply terminal 54, and allows the two insulators, namely, the insulator 70 and the adhesive layer 20, to insulate the power supply terminal 54, which is arranged in the recess 30X, from the metal plate 14.

The metal plate 14 in the above embodiment may be omitted.

The heater 15 in the above embodiment may include a single heater electrode arranged for the entire ESC attraction plate 30 or a plurality of heater electrodes arranged in correspondence with a plurality of heater zones defined in the ESC attraction plate 30. When the heater 15 includes a plurality of heater electrodes for the separate zones, the heater zones of the ESC attraction plate 30 may be separately heated.

In the above embodiment, the insulator 70 is bonded to the insulator 60. Instead, for example, the insulators 60 and 70 may be formed integrally, and the integrated insulator may be arranged in the through hole 11X.

In the above embodiment, the elastic member 53 applies elastic force to the power supply terminal 54 of the connector 50 so that the power supply terminal 54 comes in contact with the second wiring layer 43 to electrically connect the power supply terminal 54 and the second wiring layer 43. Instead, for example, the power supply terminal of the connector 50 may be electrically connected to the second wiring layer 43 by solder or the like.

The electrostatic chuck 1 may be a unipolar electrostatic chuck or a bipolar electrostatic chuck.

The electrostatic chuck 1 may be a Coulomb electrostatic chuck or a Johnsen-Rahbek electrostatic chuck.

Two or more of the above modifications may be combined.

The present examples and embodiments are to be considered as illustrative and not restrictive, and the invention is not to be limited to the details given herein, but may be modified within the scope and equivalence of the appended claims.

The invention claimed is:

1. An electrostatic chuck comprising:
a base including a first through hole extending through the base in a thickness direction;
an electrostatic chuck attraction plate bonded to the base;
an attraction electrode incorporated in the electrostatic chuck attraction plate, wherein the attraction electrode generates electrostatic charge to electrostatically attract an attraction subject with the electrostatic chuck;
a recess formed in the electrostatic chuck attraction plate in alignment with the first through hole of the base, wherein the recess partially exposes the attraction electrode;
an adhesive layer formed between the electrostatic chuck attraction plate and the base, wherein the adhesive layer covers an inner surface of the recess;
a first tubular insulator arranged in the recess, wherein the tubular insulator includes a second through hole;
a power supply terminal arranged in the first through hole of the base and the second through hole of the tubular insulator, wherein the power supply terminal includes a distal portion that is electrically connected to the attraction electrode exposed from the recess; and
a second tubular insulator that surrounds an outer surface of the first tubular insulator in the first through hole of the base with the outer surface of the first tubular insulator being bonded to the second tubular insulator by the adhesive layer, wherein the recess has a depth set in accordance with a value of a voltage applied to the attraction electrode and a breakdown characteristic of the adhesive layer.

2. The electrostatic chuck according to claim 1, wherein the adhesive layer covers the entire inner surface of the recess.

3. The electrostatic chuck according to claim 1, wherein the first tubular insulator includes a distal portion that is in contact with the attraction electrode exposed from the recess.

4. The electrostatic chuck according to claim 1, wherein the adhesive layer is a first adhesive layer, the base includes a base plate and a heater plate bonded to the base plate by a second adhesive layer,
the first through hole includes a third through hole, which extends through the base plate in a thickness direction, and a fourth through hole, which extends through the heater plate in a thickness direction and communicates with the third through hole,
the second tubular insulator arranged between the power supply terminal and the heater plate and bonded to the heater plate.

5. The electrostatic chuck according to claim 4, wherein the heater plate includes a metal plate and a heater bonded to a surface of the metal plate, and
the heater is bonded to the base plate by the second adhesive layer.

6. The electrostatic chuck according to claim 1, wherein the attraction electrode includes
a wiring layer partially exposed from the recess, and
an electrode layer electrically connected to the wiring layer, wherein the electrode layer is formed closer to an attraction surface of the electrostatic chuck attraction plate than the wiring layer.

7. The electrostatic chuck according to claim 1, wherein the first tubular insulator and the adhesive layer form a double-layer insulating structure that surrounds the power supply terminal in the recess.

8. The electrostatic chuck according to claim 4, wherein the first insulator, the second insulator, and the first adhesive layer form a triple-layer insulating structure that surrounds the power supply terminal in the fourth through hole.

9. The electrostatic chuck according to claim 8, wherein the first insulator and the first adhesive layer form a double-layer insulating structure that surrounds the power supply terminal in the recess.

10. An electrostatic chuck comprising:
an electrostatic chuck attraction plate including an attraction surface and a non-attraction surface opposite to the attraction surface;
a base including a metal plate bonded to the non-attraction surface of the electrostatic chuck attraction plate;
an attraction electrode arranged in the electrostatic chuck attraction plate and distanced from the non-attraction surface;
a recess formed in the electrostatic chuck attraction plate alignment with a first through hole of the base, wherein the recess partially exposes the attraction electrode;
a socket including a basal end, which is fixed to the base, and an elongated distal terminal, which is in contact with the attraction electrode through the first through hole of the base and the recess of the electrostatic chuck attraction plate;
an insulating adhesive layer arranged to bond the electrostatic chick attraction plate and the metal plate;
a double-layer insulating structure that surrounds the distal terminal in the recess of the electrostatic chuck attraction plate; and
a triple-layer insulating structure that surrounds the distal terminal in the metal plate of the base, wherein the triple-layer insulating structure in the metal plate includes:
a first tubular insulating member surrounding the elongated distal terminal in the metal plate and the electrostatic chuck attraction plate,
an insulating tubular portion of a second tubular insulating member that surrounds an outer surface of the first tubular insulating member in the metal plate, and a tubular part of the insulating adhesive layer occupying a tubular space defined between the first tubular insulating member and the insulating tubular portion of the second tubular insulating member with the outer surface of the first tubular insulating member being bonded to the insulating tubular portion of the second tubular insulating member by the tubular part of the insulating adhesive layer, wherein the recess has a depth set in accordance with a value of a voltage applied to the attraction electrode and a breakdown characteristic of the insulating adhesive layer.

11. The electrostatic chuck according to claim 10, wherein
the double-layer insulating structure in the electrostatic chuck attraction plate includes a portion of the first tubular insulating member, which is arranged in the recess of the electrostatic chuck attraction plate, and another portion of the insulating adhesive layer, which covers an inner surface of the recess, and
in the triple-layer insulating structure in the metal plate, the insulating tubular portion of the second tubular insulating member is arranged outside the first tubular insulating member in a part of the first through hole formed in the metal plate of the base.

* * * * *